(12) United States Patent
Patil et al.

(10) Patent No.: US 9,195,132 B2
(45) Date of Patent: Nov. 24, 2015

(54) MASK STRUCTURES AND METHODS OF MANUFACTURING

(71) Applicant: GLOBALFOUNDRIES Inc., Grand Cayman, KY (US)

(72) Inventors: Suraj K. Patil, Ballston Lake, NY (US); SherJang Singh, Clifton Park, NY (US); Uzodinma Okoroanyanwu, Northampton, MA (US); Obert R. Wood, Loudonville, NY (US); Pawitter J. S. Mangat, Clifton Park, NY (US)

(73) Assignee: GLOBALFOUNDRIES INC. (KY)

( * ) Notice: Subject to any disclaimer, the term of this patent is extended or adjusted under 35 U.S.C. 154(b) by 136 days.

(21) Appl. No.: 14/168,396

(22) Filed: Jan. 30, 2014

(65) Prior Publication Data

US 2015/0212402 A1 Jul. 30, 2015

(51) Int. Cl.
*G03F 1/24* (2012.01)

(52) U.S. Cl.
CPC ........................................ *G03F 1/24* (2013.01)

(58) Field of Classification Search
CPC ........................................................ G03F 1/24
See application file for complete search history.

(56) References Cited

U.S. PATENT DOCUMENTS

| | | | | |
|---|---|---|---|---|
| 2004/0091789 | A1* | 5/2004 | Han et al. | 430/5 |
| 2009/0148781 | A1* | 6/2009 | Kamo et al. | 430/5 |
| 2013/0196255 | A1* | 8/2013 | Hayashi | 430/5 |
| 2013/0280643 | A1* | 10/2013 | Hsu et al. | 430/5 |
| 2015/0064611 | A1* | 3/2015 | Shih et al. | 430/5 |
| 2015/0098069 | A1* | 4/2015 | Lu et al. | 355/67 |
| 2015/0147686 | A1* | 5/2015 | Lu et al. | 430/5 |

OTHER PUBLICATIONS

S. Raghunathan, et al., "Mask shadow compensation requirements for EUVL," Oral presentation at the International Symposium on Extreme Ultraviolet Lithography, Miami, Florida, Oct. 18, 2011, 17 pages.
V. Philipsen, et al., "Mask stacks for EUV imaging at high NA," Oral presentation at the IMEC Advanced Lithography Program Workshop, Leuven, Belgium, Oct. 2012, 28 pages.
V. Philipsen, et al., "Impact of mask stack on high NA EUV imaging," Oral presentation at the International Symposium on Extreme Ultraviolet Lithography, Brussels, Belgium, Sep. 30-Oct. 4, 2012, 24 pages.
T. Shoki, et al., Process Development of 6-inch EUV Mask with TaBN Absorber, Proc. SPIE. vol. 4754, pp. 857-864, 2002.

* cited by examiner

*Primary Examiner* — Stewart Fraser
(74) *Attorney, Agent, or Firm* — Heslin Rothenberg Farley & Mesiti P.C.

(57) ABSTRACT

A lithography mask structure is provided, including: a substrate; at least one reflective layer over the substrate; and an absorber film stack over the at least one reflective layer, the absorber film stack including a plurality of first film layers of a first material and at least one second film layer of a second material. The second material is different from the first material, and the second film layer(s) is interleaved with the plurality of first film layers. In one embodiment, the total thickness of the absorber film stack is less than 50 nm. In another embodiment, the reflectivity of the absorber film stack is less than 2% for a pre-defined wavelength of EUV light. In a further embodiment, the second film layer(s) prevents the average crystallite size of the first film layers from exceeding the thickness of the first film layers.

20 Claims, 5 Drawing Sheets

MASK STRUCTURES AND METHODS OF MANUFACTURING

FIELD OF THE INVENTION

The present invention generally relates to mask structures for lithography, and more specifically to extreme ultraviolet lithography mask structures used, for instance, in the patterning of circuit features.

BACKGROUND

As the dimensions of features of semiconductor devices continue to be reduced, extreme ultraviolet lithography (EUVL) has emerged as a "next generation" technology for fabricating semiconductor devices at, for instance, 16 nm half pitch and below. Because extreme ultraviolet (EUV) light wavelengths interact with matter differently than ultraviolet and deep ultraviolent light (as may be used in some lithography tools), the development of EUV lithography has presented numerous technological challenges that continue to drive innovations to improve the methods, devices, and structures used in EUVL.

SUMMARY OF THE INVENTION

The shortcomings of the prior art are overcome and additional advantages are provided through the provision, in one aspect, of a structure including a lithography mask, the mask including: a substrate; at least one reflective layer over the substrate; and an absorber film stack over the at least one reflective layer, the absorber film stack having a plurality of first film layers of a first material and at least one second film layer of a second material, the second material being different from the first material, with the at least one second film layer interleaved with first film layers of the plurality of film layers.

In another aspect, also provided herein is a method of forming a lithography mask structure, including: obtaining a substrate; forming at least one reflective layer over the substrate; providing an absorber film stack over the at least one reflective layer, where the providing includes forming a plurality of first film layers and at least one second film layer interleaved in the absorber film stack, the plurality of first film layers being made of a first material and the at least one second film layer being made of a second material, the second material being different from the first material; and selectively removing at least a portion of the absorber film stack from over the at least one reflective layer to form a lithography pattern for the lithography mask structure.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Generally stated, provided herein, in one aspect, is a structure including a lithography mask, the mask including: a substrate; at least one reflective layer over the substrate; and an absorber film stack over the at least one reflective layer, the absorber film stack having at least one first film layer of a first material and at least one second film layer of a second material, the at least one second film layer being disposed adjacent to the at least one first film layer. In one embodiment the lithography mask structure may be an extreme-ultraviolet lithography (EUVL) mask structure.

Also provided herein, in another aspect, is a method of forming a lithography mask structure, including: obtaining a substrate; forming at least one reflective layer over the substrate; providing an absorber film stack over the at least one reflective layer, where the providing includes forming a plurality of first film layers and at least one second film layer interleaved in the absorber film stack, the plurality of first film layers being made of a first material and the at least one second film layer being made of a second material, the second material being different from the first material; and selectively removing at least a portion of the absorber film stack from over the at least one reflective layer to form a lithography pattern for the lithography mask structure.

Reference is made below to the drawings, which are not drawn to scale for ease of understanding, wherein the same reference numbers used throughout different figures designate the same or similar components.

Figure 1A:
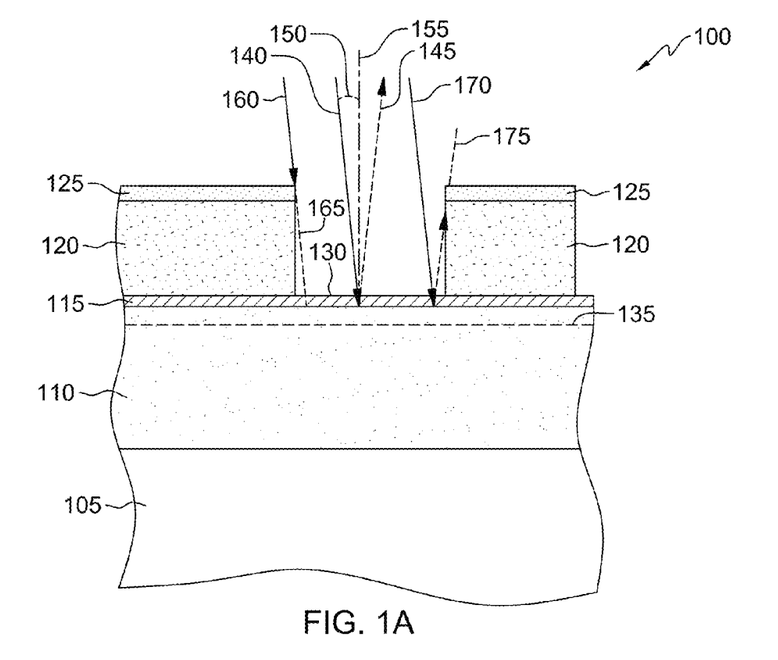
FIG. 1A depicts an example of a lithography mask, as may be used in an EUVL process, and which illustrates certain problems and limitations of using a thick absorber film to form the mask pattern.

FIG. 1A depicts a portion of one embodiment of a lithography mask structure 100, as may be used in current extreme-ultraviolet lithography (EUVL) machines, such as a 13.5 nm NXE:3300B Scanner made by ASML corporation. As shown, lithography mask structure 100 includes a substrate 105, such as a quartz substrate or a low thermal expansion material (LTEM) substrate, with one or more reflective layers 110 over the substrate, such as multiple interleaved molybdenum and silicon layer pairs. A capping layer 115, such as a ruthenium film layer, may frequently be included to protect the one or more reflective layers 110 from being damaged by etching or mask cleaning processes. A thick absorber film 120 is disposed over capping layer 115, with portions of thick absorber film 120 having been etched or otherwise removed to form the mask pattern, leaving exposed one or more reflective surfaces 130 of the mask structure. As used in EUVL processes, thick absorber film 120 portions represent lines or other desired regions or structures of a circuit structure on a wafer to be protected, while spaces between thick absorber film 120 portions represent the spaces between circuit structure features, and thus are the spaces to be etched on a wafer or a layer over the wafer. Thick absorber film 120 also includes a deep ultraviolet (DUV) anti-reflective coating (ARC) 125, which facilitates inspection of the EUVL mask pattern by a deep-ultraviolet pattern inspection tool.

As illustrated, thick absorber film 120 may be made of a tantalum-based compound, such as TaN or TaBN, and may be between 50 nm and 60 nm thick, or possibly thicker. In an EUVL process employing a mask structure such as that depicted in FIG. 1A, EUV light 140, such as light at about 13.5 nm, may be provided incident on lithography mask 100 at an angle 150 to normal 155. One angle of incidence to be employed may be about 6°, though it may be understood that slightly larger or smaller angles of incidence are feasible. Incident EUV light may reflect at surface 130, but may alternatively pass through surface 130 and reflect instead at a deeper layer within the one or more reflective layers 110. Constructive interference between individual light waves reflected at multiple different layers gives rise to an "effective reflection plane" 135 below surface 130. Reflected EUV light 145 is then transmitted to a wafer; this may be accomplished via a series of mirrors (not depicted here). However, some EUV light that should be incident on reflecting surface 130 may instead be blocked by a portion of thick absorber film 120, as illustrated by blocked EUV light wave 160, which should otherwise have continued along path 165 to be reflected. As well, some EUV light may be reflected but subsequently blocked by a portion of thick absorber film 120, as illustrated by light beam 170 whose reflected beam 175 is blocked such that it cannot be transmitted to a wafer undergoing processing. This undesired blocking of EUV light may cause several types of defects in wafer patterning, including shadowing of lines on a wafer (leading to some lines being formed wider than designed on the final wafer), portions of printed patterns shifting from their designed positions, and some contrast loss between etched spaces and pattern lines (which may lead to lines not having well-defined edges).

It should be noted that in this figure, and subsequent figures, embodiments of lithography masks are depicted with the substrate at the bottom of the figure, and with reflective surfaces and absorber film stacks at the top of the figure, in keeping with general illustration conventions for such structures. In actual use, the EUV lithography machine may use the EUVL mask face down, with reflective surfaces and absorber stacks facing down rather than up, as EUV light is reflected off the mask to a series of mirrors beneath the mask, with the mirrors reflecting the EUV light to a wafer which may be positioned below the mask.

Figure 1B:
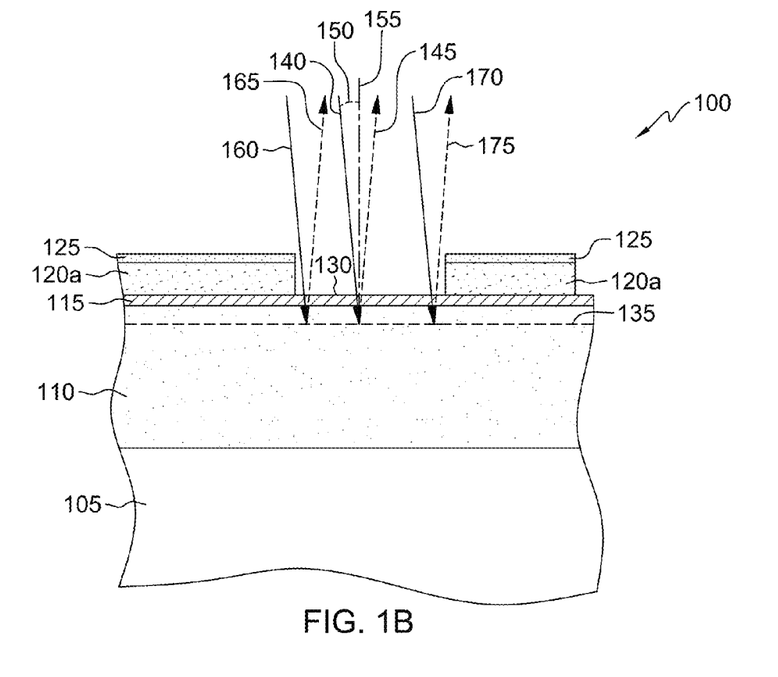
FIG. 1B depicts the lithography mask of FIG. 1A with a reduced thickness absorber film, illustrating a solution to the problems and limitations illustrated by FIG. 1A, in accordance with one or more aspects of the present invention.

FIG. 1B depicts the lithography mask 100 of FIG. 1A with a reduced thickness to absorber film 120a to demonstrate generally how the above-noted issues illustrated by FIG. 1A may be addressed and reduced or resolved. Reduced thickness absorber film 120a allows more incident EUV light 140, 160, and 170 to properly reach reflective layers 110, which may result in less shadowing, reduced pattern shifting and sharper image contrast. With such negative effects reduced, it may also be possible to create patterns on an EUVL mask structure with even smaller features and narrower spaces between features, as may be desired in some wafer designs. Reduced thickness absorber film 120a may be thinner than 50 nm, and may further be about 30 nm or less in thickness. As further detailed below, achieving such reduced thicknesses may require forming absorber film stacks of materials other than tantalum-based compounds, as tantalum-based absorber films may not be made at such reduced thicknesses while also retaining the necessary absorptivity and reflectivity properties required for EUV lithography processes.

Figure 1C:
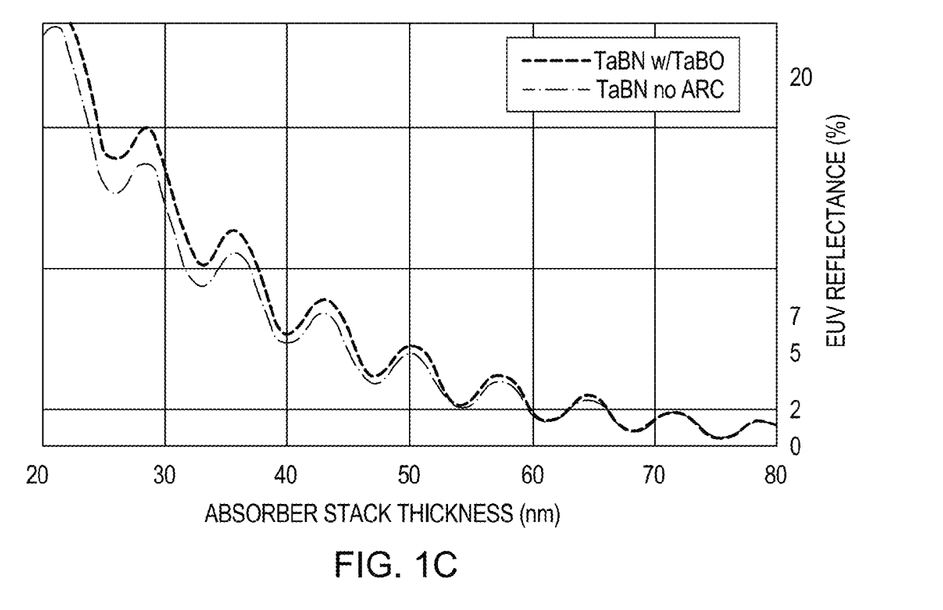
FIGS. 1C-1D are graphs illustrating the reflectivity at EUV wavelengths of tantalum-based thick absorber films as a function of absorber film thickness.
Figure 1D:
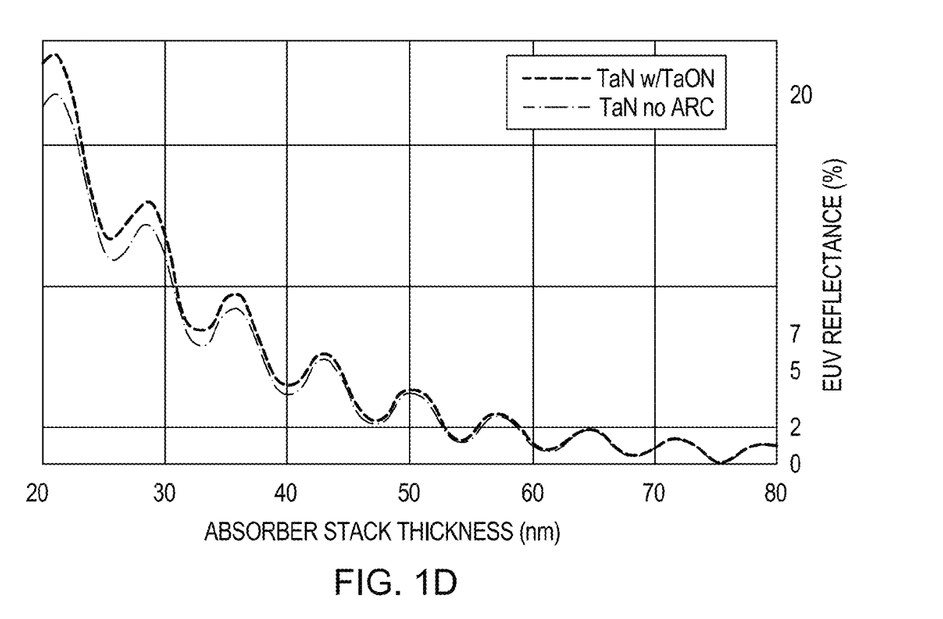

FIGS. 1C and 1D are graphs showing the reflectivity (at EUV wavelengths) of tantalum-based absorber films as a function of their thicknesses. FIG. 1C charts the reflectivity of a TaBN absorber film, both with a DUV anti-reflective coating of TaBO over the film (depicted by the solid dashed curve) and without an anti-reflective coating (depicted by the dash-dot curve). FIG. 1D charts the reflectivity of a TaN absorber film, both with a DUV anti-reflective coating of TaON over the film (depicted by the solid dashed curve) and without an anti-reflective coating (depicted by the dash-dot curve). Generally for EUV lithography mask structures, the reflectivity R of an absorber film or film stack should ideally be about 2% or lower. When the reflectivity of an absorber film or film stack exceeds this reflectivity level, EUV light reflected by the absorber film may be intense enough to partially etch portions of a wafer layer that should remain unetched, such portions of the wafer layer intended to be circuit structure features. As both FIGS. 1C and 1D show, a reflectivity R in the range of 2% or less for tantalum-based absorber films may be achieved if the films are thicker than about 50 nm. Reflectivity of tantalum-based films may only go below 2% if the films are much thicker than 60 nm. As illustrated by FIG. 1A, however, this thickness leads to undesirable issues with shadowing, pattern shift, and loss of image contrast. Thus, achieving an absorber film or film stack that both is thinner than 50 nm and has a reflectivity R of less than 2% at EUV wavelengths may require the use of alternative materials and novel arrangements of film layers, as described below.

Figure 2A:
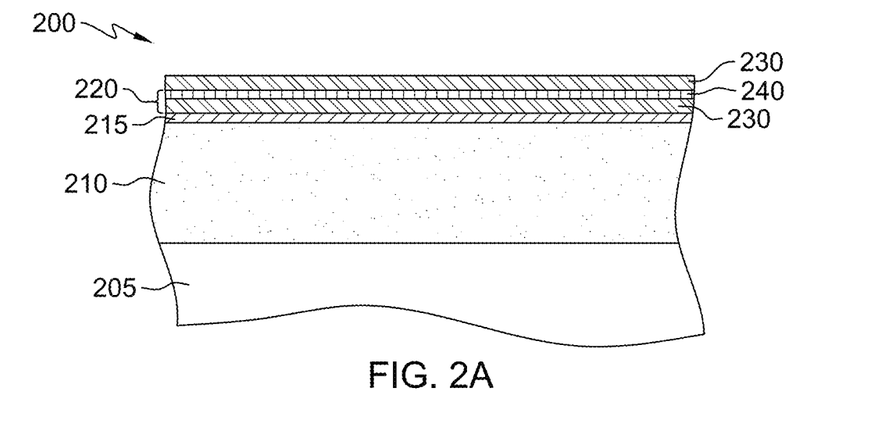
FIG. 2A depicts an embodiment of a lithography mask structure that includes a layered absorber film stack, including a plurality of first film layers and at least one second film layer interleaved with first film layers of the plurality of first film layers, in accordance with one or more aspects of the present invention.

FIG. 2A depicts a portion of one embodiment of a lithography mask structure 200 with a layered absorber film stack 220, in accordance with one or more aspects of the present invention. Lithography mask structure 200 includes, for instance, a substrate 205 which may be a quartz or LTEM substrate, one or more reflective layers 210, which may be paired molybdenum/silicon layers, above substrate 205, and a capping layer 215, which may be a ruthenium capping layer. It should be understood that other types of reflective layers or structures may be provided and may be used with the layered absorber film stacks of this invention. The layered absorber film stack 220 provided over reflective layers 210 includes a plurality of first film layers 230, made of a first material, and at least one second film layer 240, made of a second material different from the first material, that has been interleaved with first film layers 230. First film layers 230 and at least one second film layer 240 may be provided by one or more different techniques, such as vapor deposition, sputtering, and other techniques. The total thickness $T_s$ of absorber film stack 220 may be less than 50 nm. The reflectivity R of absorber film stack 220 may also be less than 2% at a pre-defined extreme ultraviolet wavelength of light to be incident on lithography mask 200. This may, for instance, be EUV light of about 13.5 nm, as may be used by an EUV lithography tool.

In one exemplary embodiment, the combined thickness $T_c$ of one first film layer of the plurality of first film layers 230 and one second film layer of the at least one second film layer 240 may be about one-half the wavelength of a pre-determined wavelength of EUV light to be incident on lithography mask 200 in an EUVL process. For EUV light of about 13.5 nm, the combined thickness $T_c$ in this example may be about 6.6 to 6.7 nm. As should be clear to those skilled in the art and the descriptions above, not all light EUV light incident on an absorber film or absorber film stack will be perfectly absorbed; some amount of light may instead be reflected. Minimizing the reflectivity of an absorber film stack, as previously described above, may be desirable for optimal wafer printing or etching. Arranging a first film layer and second film layer to have a combined thickness of about half the wavelength of incident light waves may increase destructive interference between light waves reflected at different layers of absorber film stack 220. For example, some incident EUV light waves may reflect at the exterior surface of a first film layer at the top of absorber film stack 220, while other incident EUV light waves may reflect at a layer within absorber film stack 220, such as at the interface between one of the at least one second film layers 240 and the one first film layer 230 directly beneath. Because the absorber film stack is about one-half the wavelength of the incident light waves, the phase difference between light waves reflected from these two different surfaces may be about 180°, resulting in destructive interference between the light waves that reduces or eliminates the intensity and energy of such reflected light. This may further result in reducing the overall reflectivity of absorber film stack 220. As should be clear to those skilled in the art, adding additional first film layers and additional second film layers, as further described below in one or more embodiments, may further enhance this destructive interference effect between light waves that are reflected rather than absorbed by absorber film stack 220.

In another exemplary embodiment, the first material of first film layers 230 may have an absorption coefficient k greater than about 0.04, the approximate absorption coefficient of tantalum, for EUV wavelengths of about 13.5 nm. Using a material or materials with a higher absorption coefficient than tantalum may help in forming highly absorptive absorber film stacks that are thinner than tantalum-based films. Although many elements are known to have higher absorption coefficients k at EUV wavelengths than tantalum, many of these elements may be sub-optimal choices as absorber film materials for one or more reasons. These elements may be too soft (e.g., gold or silver), radioactive (e.g., actinium), poisonous (e.g., antimony or cadmium), and/or deteriorate quickly when exposed to atmosphere (e.g., iron or copper). As well, in order to form a desired pattern on lithography mask 200, the first material may need to be a material that can be selectively etched. Some optimal choices for the first material may therefore be nickel, palladium, platinum, and cobalt, as each of these elements has an absorption coefficient k at EUV wavelengths that is higher than the absorption coefficient of tantalum while lacking one or more of negative characteristics of other elements described above. The respective oxides or nitrides of nickel, cobalt, palladium, and cobalt may also provide an optimal choice for the first material. The first material may thus, in one example, be a single metal. The first material may alternatively be a single metal oxide or a single metal nitride. In another example, the first material may be a binary metal alloy, such as nickel-platinum (NiPt), or alternatively may be a binary metal oxide or a binary metal nitride. In yet another example, the first material may be a ternary metal alloy, or alternatively may be a ternary metal nitride or a ternary metal oxide. Such binary or ternary metal alloys, or their respective nitrides or oxides, may provide additional advantages to absorber film stack 220; for example, a NiPt film may be more highly resistant to a lithography mask cleaning process than a pure nickel film. While it may be feasible to form any one first film layer to any particular thickness, in one or more exemplary embodiments the thickness $T_f$ of any one first film layer of the plurality of film layers may be between about 3.0 nm and 7.0 nm. Forming one or more of the plurality of first film layers to a thickness $T_f$ in this range may facilitate, for example, achieving a combined thickness $T_c$ for one first film layer and one second film layer of about half the wavelength of light to be incident on lithography mask 200, particularly EUV light as used in EUVL processes. Other advantages, such as keeping absorber film stress below a pre-determined maximum value, for instance below about 200 MPa, in order to preserve pattern shape accuracy may also be realized.

In a further exemplary embodiment, one first film layer of the plurality of first film layers 230 may have an average crystallite size $C_f$ and a thickness $T_f$ and the at least one second film layer 240 interleaved with first film layers 230 may be selected and positioned to keep the average crystallite size $C_f$ from exceeding $T_f$. Materials that may be used to form first film layers 230, including nickel, cobalt, platinum, palladium, and alloys of these metals, may tend to naturally form crystalline structures internally, and thus will have or acquire an average crystallite size $C_f$. When such materials are deposited or layered up to form a film, the average crystallite size tends to increase with increasing thickness $T_f$ of the material, and the average crystallite size may, beyond a certain thickness, exceed the thickness of the film layer. For example, a pure nickel film formed to a thickness of about 25 nm may have an average crystallite size of about 29 nm to 30 nm. This may result in excessive surface roughness or texture, and may undesirably affect the absorptive or reflective properties of the film. By interleaving at least one second film layer 240 between first film layers 230, where the second film layer is made of a second material different from the first material, the first film layers 230 are prevented from being in contact with each other. Thus, the first material of the first film layers is prevented from forming larger crystallites with a size that exceeds the thickness of the first film layers. While many possible materials may be used as the second material, in one or more exemplary embodiments the second material of the at least one second film layer may be a metal oxide or a metal nitride, or a combination thereof. Metal nitrides or metal oxides, alone or in combination, may particularly form effective second film layers where the plurality of first film layers are made of a metal or metal alloy, as described above. For example, if the first material for the first film layers is chosen to be NiPt, the second material for the at least one second film layer may be chosen to be TiN (titanium nitride). While it may be feasible to form any one second film layer of the at least one second film layer to any particular thickness, in one or more exemplary embodiments the thickness $T_s$ of any one second film layer of the at least one second film layer may be between about 2.0 nm and 6.0 nm. Forming at least one second film layer to a thickness $T_s$ in this range may facilitate, for example, achieving a combined thickness $T_c$ for one first film layer and one second film layer of about half the wavelength of light to be incident on lithography mask 200, particularly EUV light as used in EUVL processes. Other advantages, such as keeping absorber film stress below a predetermined maximum value, for instance below about 200 MPa, in order to preserve pattern shape accuracy may also be realized.

Figure 2B:
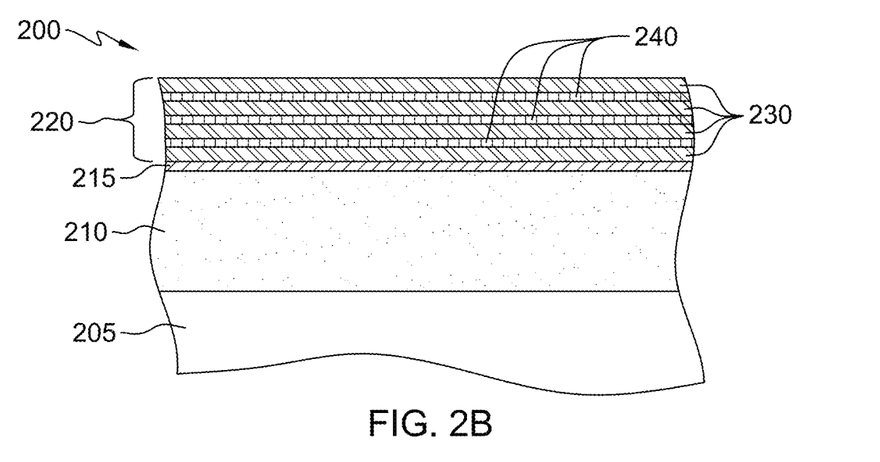
FIG. 2B depicts the lithography mask structure of FIG. 2A, with additional interleaved first and second film layers added, in accordance with one or more aspects of the present invention.

FIG. 2B depicts lithography mask 200 of FIG. 2A with additional first film layers 230 and second film layers 240 provided, with the second film layers 240 interleaved between first film layers 230. A plurality of first film layers and a plurality of second film layers may form a more optimized absorber film stack, as multiple first film layers and multiple second film layers may increase the absorptive properties and reduce the reflectivity R of absorber film stack 220, as described above. In general, it may be desirable to form enough first film layers and second film layers to achieve a desired reflectivity R for absorber film stack 220 without forming so many layers that the total thickness $T_s$ of absorber film stack 220 exceeds a pre-determined threshold.

In one exemplary embodiment, the first material of first film layers 230 may be NiPt, and the second material of second film layers 240 may be TiN. The combined thickness $T_c$ of any one first film layer 230 of NiPt and an adjacent second film layer 240 of TiN may, as described above, be approximately one-half of the wavelength of EUV light to be incident on EUVL mask structure 200 in an EUVL process; for EUV light of about 13.5 nm, combined thickness $T_c$ of an adjacent NiPt and TiN layer may be about 6.6 nm to 6.7 nm. This may be ideally achieved, for example, by forming each NiPt layer to a thickness of approximately 4.7 nm and forming each TiN layer to a thickness of approximately 2.0 nm. While any number of NiPt layers and TiN layers may conceivably be formed and interleaved to form absorber film stack 220, in an exemplary embodiment absorber film stack includes four NiPt layers and three TiN layers. Such an absorber film stack may have a reflectivity of about 2% or less for EUV light at about 13.5 nm, and may have a total thickness $T_s$ of about 25 nm or less. It may be understood that this describes just one exemplary embodiment of the present invention, and that many other choices for a first material and/or a second material may possibly achieve similar absorber film stacks with a low reflectivity R and total thickness $T_s$ less than 50 nm.

Figure 2C:
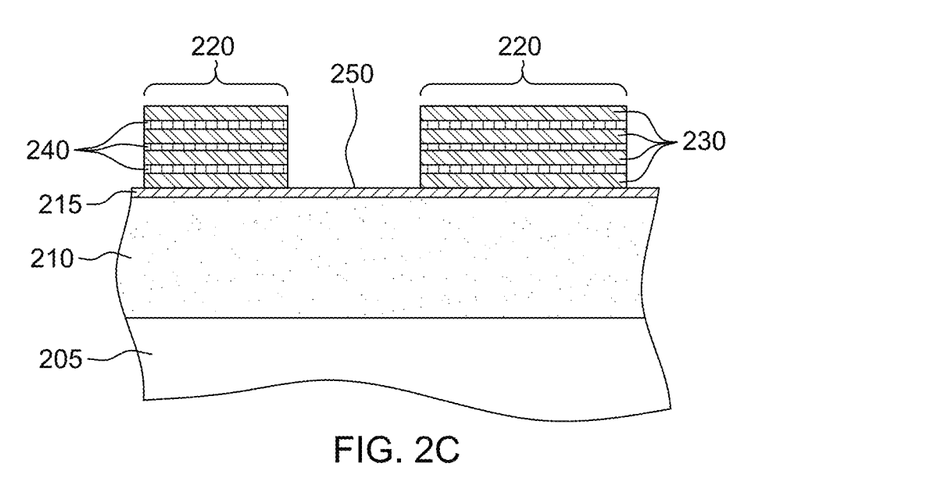
FIG. 2C depicts the lithography mask structure of FIG. 2B following an etching process to form a lithography pattern for the lithography mask structure, in accordance with one or more aspects of the present invention.

FIG. 2C depicts lithography mask 200 of FIG. 2B with a portion of first film layers 230 and second film layers 240 removed to expose at least a portion of reflective surface 250 of the underlying lithography mask's reflective layers 210, 215. This removal may be achieved by any process that selectively removes a portion or portions of the absorber film stack, and may further be an etching process that does not damage reflective layers 210, 215 or reflective surface 250. For example, an electron beam writing process may be used to form a desired pattern, followed by etching via an inductive coupled plasma etching system. It may be understood that this illustrates only one possible method for forming a desired lithography mask pattern combining one or more reflective surfaces 250 and layered absorber film stacks 220. Other methods of selectively removing at least a portion of the absorber film stack or forming a lithography mask pattern may also be possible.

Figure 2D:
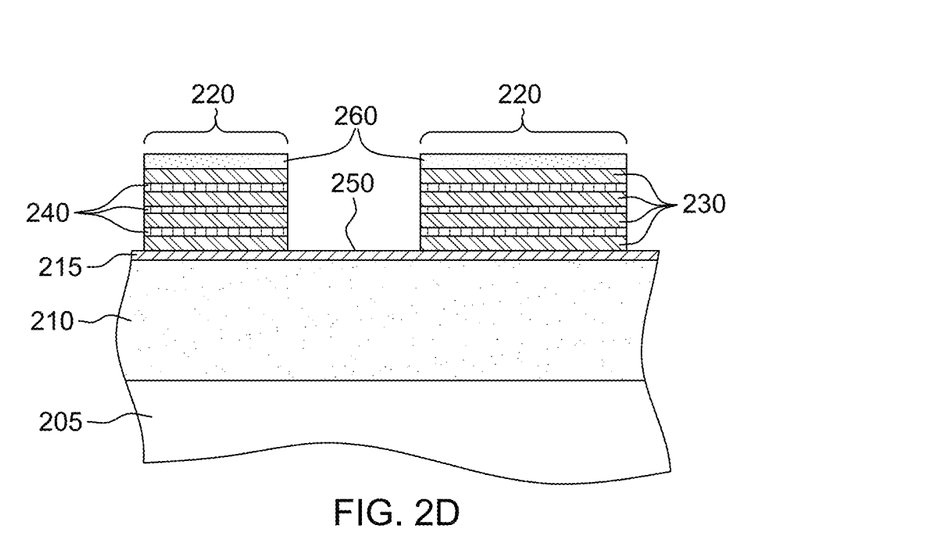
FIG. 2D depicts an alternative embodiment of the lithography mask structure of FIG. 2C in which the absorber film stack further includes a deep ultraviolet (DUV) anti-reflective coating layer, in accordance with one or more aspects of the present invention.

FIG. 2D depicts an alternative embodiment of lithography mask 200 depicted in FIG. 2C, in which a deep-ultraviolet (DUV) anti-reflective coating (ARC) layer 260 has also been provided as part of absorber film stacks 220 over first film layers 230 and second film layers 240. Such anti-reflective coating layers may be provided in lithography mask structures, particularly EUVL mask structures, to assist in the use of deep-ultraviolet inspection tools so that completed EUVL mask structures and patterns may be checked for accuracy or defects prior to actual use. DUV ARC layer 260 may also provide other advantages, such as enhancing the phase-shift differential between light reflected from the one or more reflective layers 210 and the small amount of light reflected from absorber film stack 220; this may, for example, have the effect of sharpening image contrast, which may further result in more accurately etched structures and spaces between structures on a patterned wafer.

Figure 3:
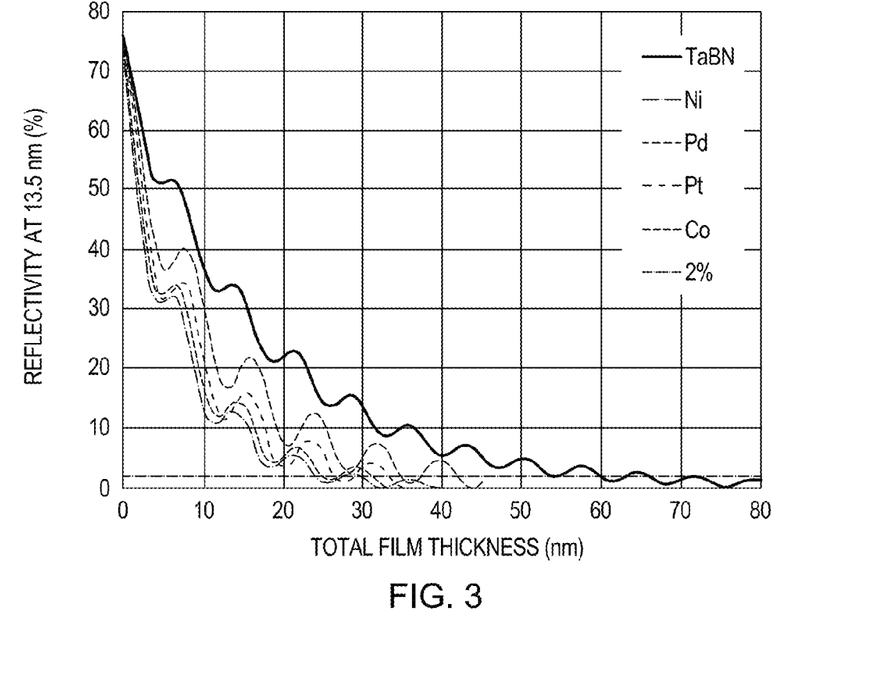
FIG. 3 is a graphical comparison of the reflectivity of a tantalum-based thick absorber film, as a function of film stack thickness, to the reflectivity of absorber films made of alternative materials with higher absorption coefficients than tantalum, in accordance with one or more aspects of the present invention.

FIG. 3 is a graphical comparison of a tantalum-based absorber film (TaBN) with example absorber films formed of nickel, cobalt, palladium, or platinum, as described above in one or more embodiments. FIG. 3D charts the reflectance, at EUV wavelengths, of each type of absorber film as a function of the film's thickness. Generally, reflectance tends to decrease with increasing thickness; the sinusoidal variation over small ranges of thicknesses results from varying degrees of destructive interference or constructive interference among EUV light waves reflected at different depths within each type of absorber film, as described previously. As the chart illustrates, a TaBN absorber film may have the desired reflectance of 2% or less only when the absorber film is formed thicker than about 50 nm, and may achieve lower reflectance values only when formed thicker than about 60 nm. By contrast, absorber films formed of any one of nickel, cobalt, palladium, or platinum reach the desired reflectance R of 2% at thicknesses less than about 40 nm. With the exception of palladium, each of these metals achieves a reflectance value R of less than 2% at thicknesses less than about 30 nm. Thus, any one of these metals, by itself, may provide an absorber film with optimally low reflectance at much lower thicknesses than tantalum-based compounds. However, as previously discussed, such pure metal absorber film stacks may also have undesired drawbacks, such as having average crystallite sizes that exceed the film's thickness, making such pure metal films sub-optimal choices for absorber films.

Figure 4:
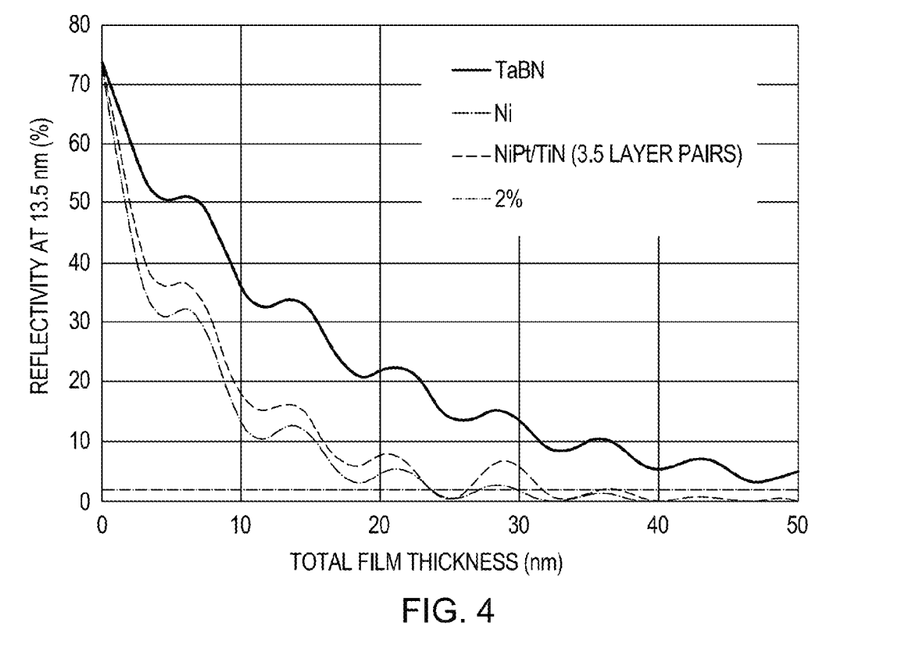
FIG. 4 is a graphical comparison of the reflectivity of a tantalum-based thick absorber film, as a function of film stack thickness, to the reflectivity of both a pure nickel absorber film and a layered film stack that includes both first material film layers and second material film layers, in accordance with one or more aspects of the present invention.

FIG. 4 also provides a graphical comparison of different absorber films or film stacks, charting reflectance at EUV wavelengths as a function of film stack thickness, with an exemplary absorber film stack containing multiple interleaved layers of NiPt and TiN charted in comparison to both a pure nickel film stack and a conventional TaBN film stack. Here the NiPt/TiN layered absorber film stack has 3.5 layered pairs—in other words, 3 pairs of NiPt and TiN layers, with an additional fourth layer of NiPt. As the graph illustrates, the reflectivity of the layered NiPt/TiN absorber film stack is comparable to a pure nickel film at a thickness around 25 nm. Four layers of NiPt/TiN interleaved with three layers of TiN has a reflectance of about 0.82% at a total thickness $T_s$ of about 24.8 nm, whereas a similar pure nickel stack of about 25.4 nm has a slightly higher reflectance of about 0.94%. Additionally, whereas a pure nickel film of about 25 nm thickness may have an average crystallite size of 29 nm to 30 nm, as previously described, the crystallite size of the NiPt layers in the NiPt/TiN absorber film stack may be about 3.5 nm to 4 nm, less than the approximately 4.7 nm thickness of those layers.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A structure comprising:
   a lithography mask comprising:
      a substrate;
      at least one reflective layer over the substrate; and
      an absorber film stack over the at least one reflective layer, the absorber film stack comprising a plurality of first film layers and at least one second film layer, the first film layers comprising a first material and the at least one second film layer comprising a second material, the second material being different from the first material, wherein the at least one second film layer is interleaved with first film layers of the plurality of first film layers.

2. The structure of claim 1, wherein the absorber film stack has a thickness $T_s$, where $T_s$ is less than 50 nm.

3. The structure of claim 1, wherein the absorber film stack has a reflectivity value R, where R is less than 2% for a pre-defined extreme ultraviolet wavelength of light to be incident on the lithography mask.

4. The structure of claim 1, wherein one first film layer of the plurality of first film layers and one second film layer of the at least one second film layer have a combined thickness $T_c$, wherein thickness $T_c$ is approximately equal to one-half of a pre-defined wavelength of extreme ultraviolet light to be incident on the lithography mask.

5. The structure of claim 1, wherein one first film layer of the plurality of first film layers comprises an average crystallite size $C_f$ and a thickness $T_f$, and wherein the at least one second material film layer interleaved with the first film layers is selected and positioned to prevent the average crystallite size $C_f$ from exceeding thickness $T_f$.

6. The structure of claim 1, wherein the first material has an absorption coefficient k, where k is greater than about 0.04 for a pre-defined wavelength of EUV light to be incident on the lithography mask.

7. The structure of claim 1, wherein the first material comprises one or more metals, metal nitrides, or metal oxides which can be selectively removed from over the at least one reflective layer.

8. The structure of claim 7, wherein the first material comprises at least one of nickel, cobalt, platinum, palladium, or a respective oxide or nitride thereof.

9. The structure of claim 7, wherein the first material comprises a binary metal alloy or a respective oxide or nitride thereof.

10. The structure of claim 7, wherein the first material comprises a ternary metal alloy or a respective oxide or nitride thereof.

11. The structure of claim 7, wherein the thickness $T_f$ of one first film layer of the plurality of first film layers is between about 3.0 nm and 7.0 nm.

12. The structure of claim 1, wherein the second material comprises a metal nitride, a metal oxide, or a combination thereof.

13. The structure of claim 12, wherein one second film layer of the at least one second film layer has a thickness $T_s$, where $T_s$ is between about 2.0 nm and 6.0 nm.

14. The structure of claim 1, wherein the absorber film stack comprises an absorber film stress, the absorber film stress being less than about 200 MPa.

15. The structure of claim 1, wherein the absorber film stack comprises a plurality of second film layers, the at least one second film layer being at least one second film layer of the plurality of second film layers.

16. The structure of claim 15, wherein the first material comprises NiPt and the second material comprises TiN, and wherein at least one first film layer of the plurality of first film layers has a thickness $T_f$ of about 4.7 nm and at least one second film layer of the plurality of second film layers has a thickness $T_s$ of about 2.0 nm.

17. The structure of claim 1, wherein the absorber film stack further comprises a deep-ultraviolet anti-reflective coating over the plurality of first film layers and the at least one second film layer.

18. A method comprising:
   forming a lithography mask structure, the forming comprising:
      obtaining a substrate;
      forming at least one reflective layer over the substrate;

providing an absorber film stack over the at least one reflective layer, the providing comprising forming a plurality of first film layers and at least one second film layer interleaved in the absorber film stack, the plurality of first film layers comprising a first material, and the at least one second film layer comprising a second material, the second material being different from the first material; and selectively removing at least a portion of the absorber film stack from over the at least one reflective layer.

19. The method of claim 18, wherein one first film layer of the plurality of first film layers comprises an average crystallite size $C_f$ and a thickness $T_f$, and wherein interleaving the at least one second film layer with the plurality of first film layers prevents contact between the one first film layer and an adjacent first film layer of the plurality of first film layers to prevent the average crystallite size $C_{fm}$ from exceeding the thickness $T_{fm}$.

20. The method of claim 18, wherein the first material comprises at least one of nickel, cobalt, platinum, or palladium, and the second material comprises a metal nitride, a metal oxide, or a combination thereof.

* * * * *